(12) United States Patent
Lai et al.

(10) Patent No.: US 6,355,539 B1
(45) Date of Patent: Mar. 12, 2002

(54) METHOD FOR FORMING SHALLOW TRENCH ISOLATION

(75) Inventors: Erh-Kun Lai, Taichung; Shou-Wei Huang, Chilung; Yu-Ping Huang, Taichung, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/849,245

(22) Filed: May 7, 2001

(51) Int. Cl.[7] .............................................. H01L 21/76
(52) U.S. Cl. ........................ 438/424; 438/426; 438/435; 257/510
(58) Field of Search ................................ 438/296, 424, 438/426, 435; 257/510

(56) References Cited

U.S. PATENT DOCUMENTS

| 5,506,168 A | * | 4/1996 | Morita et al. ................ 438/424 |
| 5,554,256 A | * | 9/1996 | Pruijmboom et al. ..... 156/643.1 |
| 5,897,361 A | * | 4/1999 | Egawa ........................ 438/435 |
| 5,990,002 A | * | 11/1999 | Niroomand et al. ......... 438/636 |
| 6,096,622 A | * | 8/2000 | Kim et al. ................... 438/424 |
| 6,214,696 B1 | * | 4/2001 | Wu .............................. 438/424 |
| 6,238,997 B1 | * | 5/2001 | Chen et al. ................. 438/400 |
| 6,284,623 B1 | * | 9/2001 | Zhang et al. ................ 438/424 |

\* cited by examiner

*Primary Examiner*—Charles Bowers
*Assistant Examiner*—David S Blum

(57) ABSTRACT

A method for forming a shallow trench isolation is disclosed. The method avoids using any silicon nitride material to prevent the kooi effect and use spacers to protect the corner portions of the STI. A conductive layer is used to replace the conventional used silicon nitride layer in the formation of conventional STI regions. The invention also uses a dielectric layer comprising a pad oxide layer as a sacrificial oxide layer so that an additional sacrificial oxide layer is no longer needed. The conductive layer will be oxidized together with the substrate in the formation of the gate oxide layer so that the isolation quality will not be degraded.

20 Claims, 5 Drawing Sheets

METHOD FOR FORMING SHALLOW TRENCH ISOLATION

BACKGROUND OF THE INVENTION

1. Field of the Invention

The present invention relates to a method for forming a shallow trench isolation, and more particularly to a method for forming a shallow trench isolation having protective spacers on both sides without using any silicon nitride layer.

2. Description of the Related Art

As the density of integrated circuits increases, the dimension of an isolation region between active regions in semiconductor devices decreases. With this trend, the conventional local oxidation of silicon (LOCOS) method for isolating active regions, which forms a field oxide layer by using a thermal oxidation technique, confronts the limit in the effective isolation length, thereby degrading characteristics of the isolation region. Furthermore, the conventional LOCOS method possesses some inherent drawbacks resulting from the processes, i.e., lateral oxidation of the silicon underneath the silicon nitride mask, making the edge of the field oxide resemble the shape of a bird's beak.

According to the disadvantages for LOCOS isolation structures mentioned above, an isolation technique using trenches has been developed. Generally, the trench isolation includes the steps of etching a silicon substrate to form a trench, depositing a oxide layer by using a chemical vapor deposition (CVD) process to fill up the trench, providing the oxide layer a planarized surface by using a chemical 1 mechanical polish (CMP) process, and removing the oxide layer upon the active regions.

According to the technique, the semiconductor substrate is etched at a predetermined depth, thereby providing excellent characteristics of the device isolation. Furthermore, the field oxide layer is formed by using a CVD technique, so that the device isolation region that is defined by a photolithography process can be maintained throughout. The device isolation technique set forth is also known as shallow trench isolation (STI) processes.

However, conventional shallow trench isolation processes still have several drawbacks. FIG. 1A shows a cross-sectional diagram of a shallow trench isolation amid a STI conventional process. A substrate 100, a silicon dioxide layers 102, a silicon nitride layer 104 and a linear oxide layer 106 are also shown in FIG. 1A. During the wet etching process to form the masking nitride layer 104 by hot phosphoric acid, the etchant also attacks the underlying polysilicon or silicon of the substrate 100 in the vicinity of the oxide layer 102. This pitting formation seriously damages the substrate 100 thereby degrades the quality of the diffusion regions. The pitting formation is also found in the buffer polysilicon after wet nitride removal and in silicon substrate after polysilicon etching. It is attributed to a chemical reaction of water, ammonia, and silicon during wet field oxidation, similar to the so-called white-ribbon effect. The mechanism of this reaction is investigated by T. T. Sheng, et al., in the paper "From White Ribbon to Black Belt: A Direct Observation of the Kooi Effect Masking Film by Transmission Electron Microscopy", J. Electrochem. Soc., vol. 140, p. L.163, 1993. This mechanism induces damages to the substrate and results in yield loss in deep submicron devices. To solve the problems mentioned above, modern semiconductor sector uses a sacrificial oxide layer to remove the pitting but this costs additional process step and time. Besides, owing to the high tensile stress of a silicon nitride layer which is larger than $10^9$ dyne/cm$^2$, additional process such as a sacrificial oxide process used to reduce the tensile stress and remove the damaged portion of the substrate is needed.

Another problem of conventional STI process results from the oxide etching process as shown in FIG. 1B. The STI is completed by using a series of conventional processes comprising oxide filling deposition, chemical mechanical polishing and etching. As shown in FIG. 1B, the corners portions of STI oxide 108 have troubling fillisters which could cause leakage current and result in STI failure. The fillisters is formed because the wet etching rate on the corner portion is always higher.

In view of the drawbacks mentioned with the prior art process, there is a continued need to develop new and improved processes that overcome the disadvantages associated with prior art processes. The requirements of this invention are that it solves the problems mentioned above.

SUMMARY OF THE INVENTION

It is therefore an object of the invention to provide a STI process without using any silicon nitride thereby prevent the kooi effect and reduce the stress caused by silicon nitride.

It is another object of this invention to provide a STI structure having protective spacers to protect the corner portions of the STI.

It is a further object of this invention to provide a reliable STI process and structure which can assure the isolation quality between the active regions.

To achieve these objects, and in accordance with the purpose of the invention, the invention uses a method comprising: providing a substrate having a first dielectric layer thereon and a first conductive layer over the first dielectric layer; forming a second dielectric layer over the first conductive layer; forming a second conductive layer over the second dielectric layer; forming a trench into the second conductive layer, the second dielectric layer, the first conductive layer, the first dielectric layer and the substrate; conformally forming a linear dielectric layer over the trench; filling the trench with a dielectric material to form a trench isolation; removing the second conductive layer; forming a third dielectric layer over the second dielectric layer and the trench isolation; anisotropically etching the third dielectric layer and the second dielectric layer to expose the first conductive layer; etching the first conductive layer to expose the first dielectric layer; etching the first dielectric layer to expose the substrate; and oxidizing the substrate.

The invention avoids using any silicon nitride material to prevent the kooi effect and reduce the stress caused by silicon nitride. The invention also uses spacers to protect the corner portions of the STI. The first conductive layer comprising a polysilicon or an amorphous layer is used to replace the conventional used silicon nitride layer in the formation of conventional STI regions. The invention also uses the first dielectric layer comprising a pad oxide layer as a sacrificial oxide layer so that an additional sacrificial oxide layer is no longer needed. The high selectivity ratio between the first dielectric layer comprising a silicon dioxide layer and the first conductive layer comprising a polysilicon or an amorphous silicon layer renders the first dielectric layer undamaged in the formation of the STI of this invention. The first conductive layer comprising a polysilicon or an amorphous silicon layer will be oxidized together with the substrate in the formation of the gate oxide layer so that the isolation quality can be maintained. The spacers can protect the STI during the various process steps such as wet etching so that the isolation between adjacent active regions can be assured.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
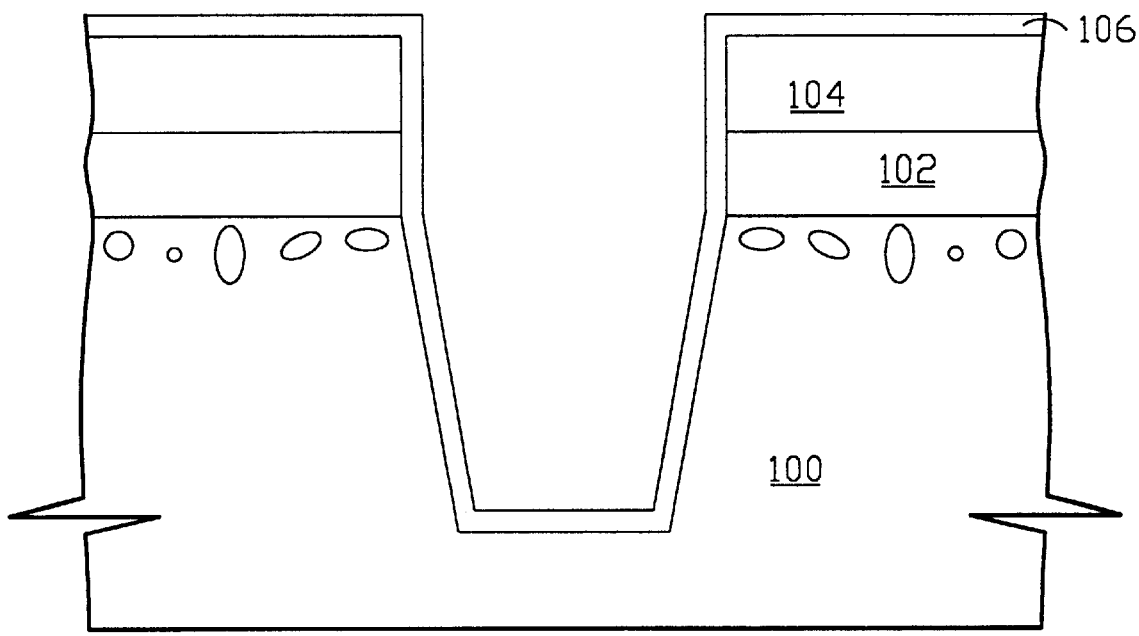
FIG. 1A shows a cross-sectional diagram of a shallow trench isolation amid a STI conventional process.
Figure 1B:
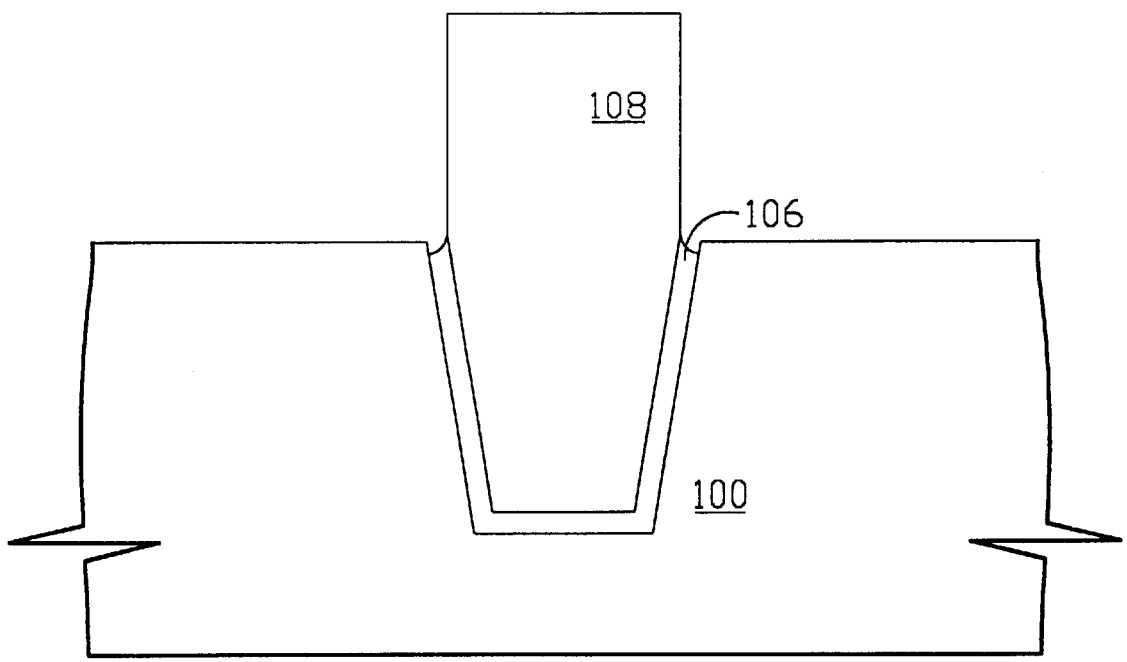
FIG. 1B shows a schematic cross-sectional diagram of a conventional STI having troubling fillisters on its corner portions.
Figure 2A:
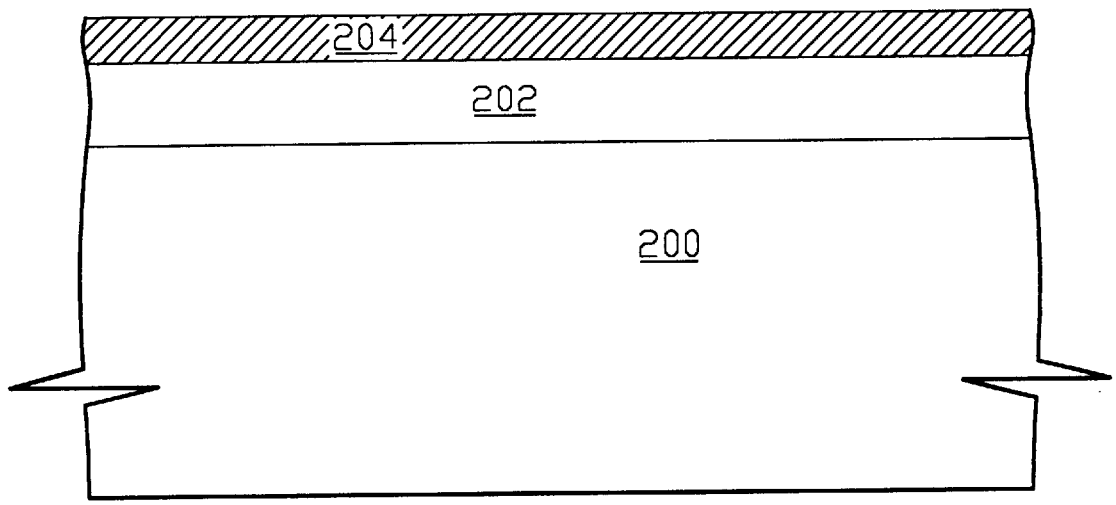
FIG. 2A shows a dielectric layer and a conductive layer sequentially formed over a substrate.

Referring to FIG. 2A, a dielectric layer 202 and a conductive layer 204 are sequentially formed over a substrate 200. The substrate 200 preferably comprises, but is not limited to: a silicon substrate with a <100> crystallographic orientation. The substrate can also comprise other semiconductor substrate such as diamond-like carbon as well as germanium, gallium arsenide and indium arsenide. The dielectric layer 202 preferably comprises, but is not limited to: a pad oxide layer formed by a thermal growth process. The dielectric layer 202 has a thickness of from about 100 angstrom to about 200 angstrom, and the thickness is preferably about 200 angstrom. The conductive layer 204 preferably comprises a polysilicon layer or an amorphous silicon layer formed by conventional methods such as chemical vapor deposition and physical vapor deposition, but other material met the spirit of this invention should not be excluded. The conductive layer 204 preferably has a thickness of from about 50 angstrom to about 200 angstrom.

Figure 2B:
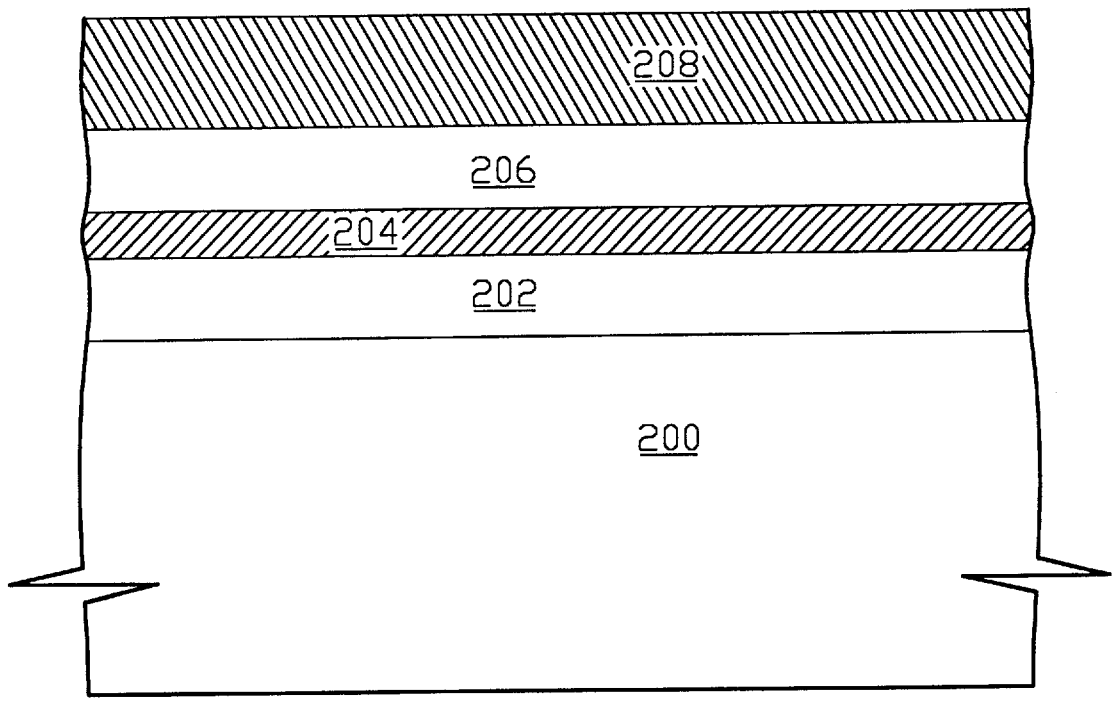
FIG. 2B shows a result of sequentially forming a dielectric layer and a conductive layer over the structure shown in FIG. 2A.

Referring to FIG. 2B, a dielectric layer 206 and a conductive layer 208 are sequentially formed over the structure shown in FIG. 2A. The dielectric layer 206 preferably comprises, but is not limited to: a silicon dioxide layer formed by conventional methods such as chemical vapor deposition and physical vapor deposition. The dielectric layer 206 has a thickness of from about 200 angstrom to about 500 angstrom. The conductive layer 208 preferably comprises a polysilicon layer formed by conventional methods such as chemical vapor deposition, but other material met the spirit of this invention should not be excluded. The conductive layer 208 has a thickness of from about 600 angstrom to about 1200 angstrom, and the thickness is preferably about 1000 angstrom.

Figure 2C:
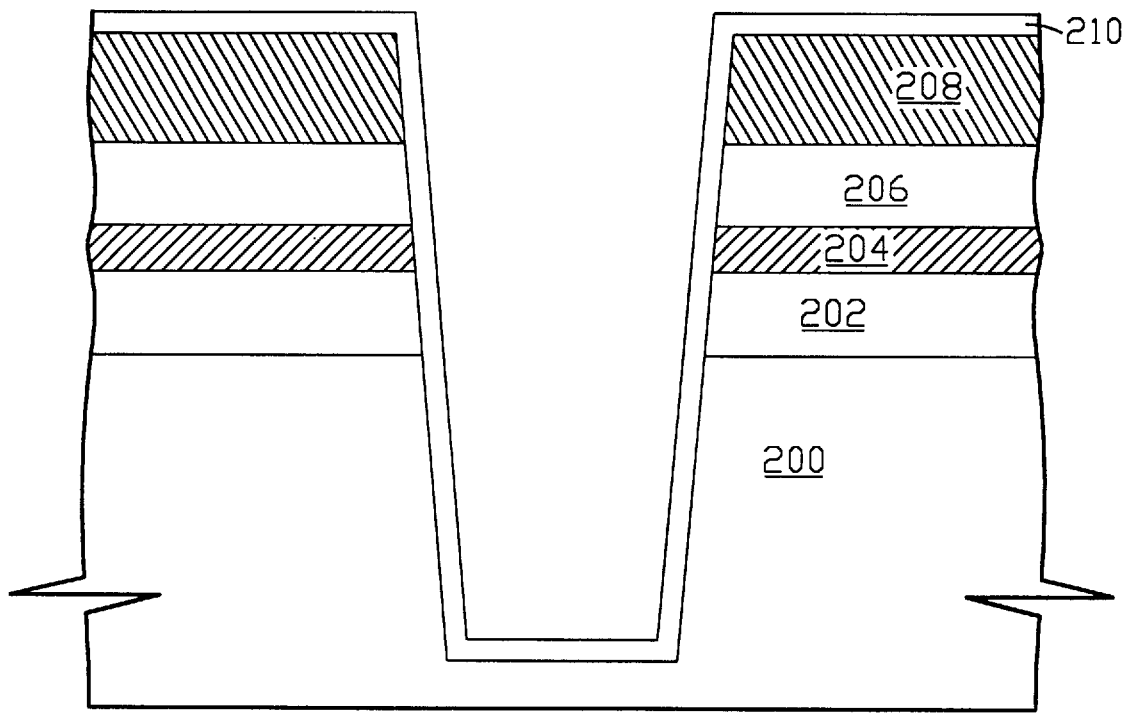
FIG. 2C shows a result of forming a trench into the structure shown in FIG. 2B and conformally forming a dielectric layer thereon.

Referring to FIG. 2C, a trench is formed by etched the conductive layer 208, the dielectric layer 206, the conductive layer 204, the dielectric layer 202 and the substrate 200 and a dielectric layer 210 is conformally formed over the conductive layer 208 and the trench. The depth of the trench depends on what kind of device the STI isolates, for example, the depth is about 4000 angstrom for a flash memory and it is about 2900 angstrom for a logic device such as a metal oxide semiconductor (MOS) transistor. The trench is preferably formed by anisotropic etching such as reactive ion etching, but other conventional etching method should be used. The dielectric layer 210 preferably comprises a linear oxide layer formed by thermally growth. The dielectric layer 210 has a thickness of from about 100 angstrom to about 500 angstrom.

Figure 2D:
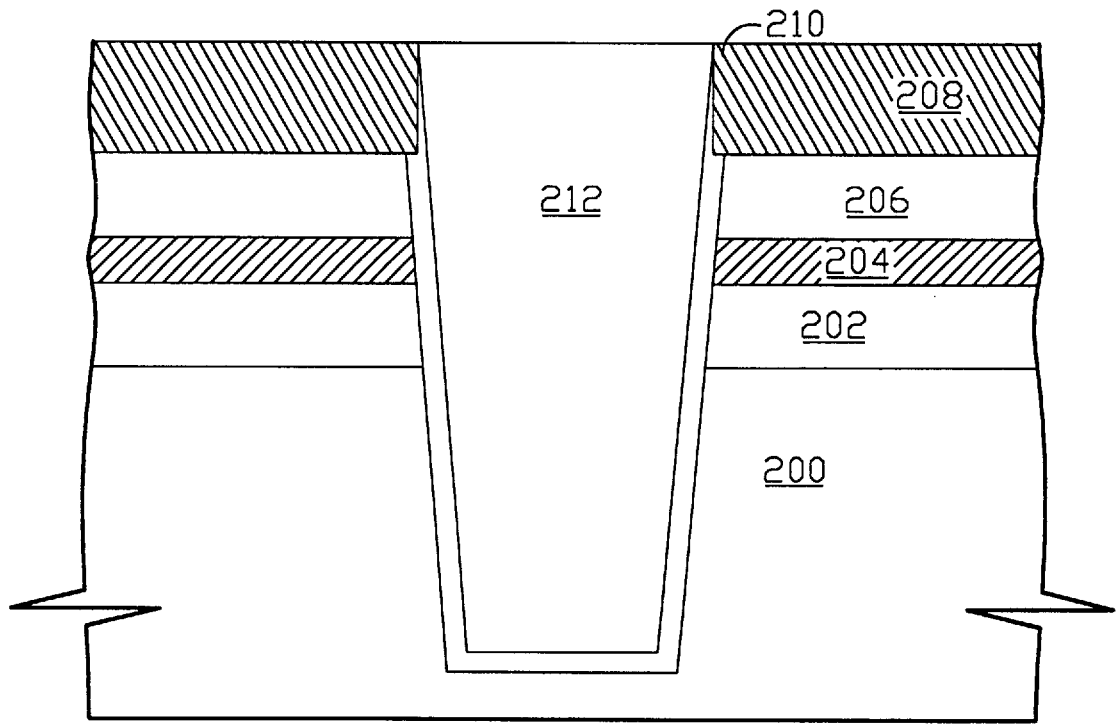
FIG. 2D shows a result of filling the trench to form a STI and planarizing the STI.

Referring to FIG. 2D, the trench shown in FIG. 2C is filled with a dielectric layer 212 and the portions of the dielectric layer 212 and the dielectric layer 210 over the conductive layer 208 are removed by using conventional techniques such as chemical mechanical polishing so that a planarized surface is provided. The dielectric layer 212 preferably comprises, but is not limited to: an oxide layer formed by a high density plasma (HDP) chemical vapor deposition (CVD) process. Other dielectric materials met the spirit of this invention should not be excluded. For modern deep submicron semiconductor technologies, in view of the tiny feature of devices, a HDPCVD process is preferably used. High density plasma (HDP) oxide deposition is defined as chemical vapor deposition with simultaneous DC-bias sputtering using a mixture of silicon-containing, oxygen containing and non-reactive gasses (e.g., noble gasses). High density plasma sources supply low-energy ions with densities greater than $10^{12}$ cm$^{-2}$. In HDP oxide deposition, bias sputtering can be also achieved by a RF bias separately applied to the substrate to avoid charge accumulation. During deposition, the substrate is self-biased to a DC voltage that serves to accelerate Ar$^+$ ions for Bias sputtering and controlling the film properties, deposition rates, etc. This method generally forms a high quality oxide with good thermal stability, low moisture uptake and fine. mechanical properties. It is recognized that HDP-SiO$_2$ deposition techniques employs simultaneous deposition and DC-bias sputtering to enhance gap-filling ability.

Figure 2E:
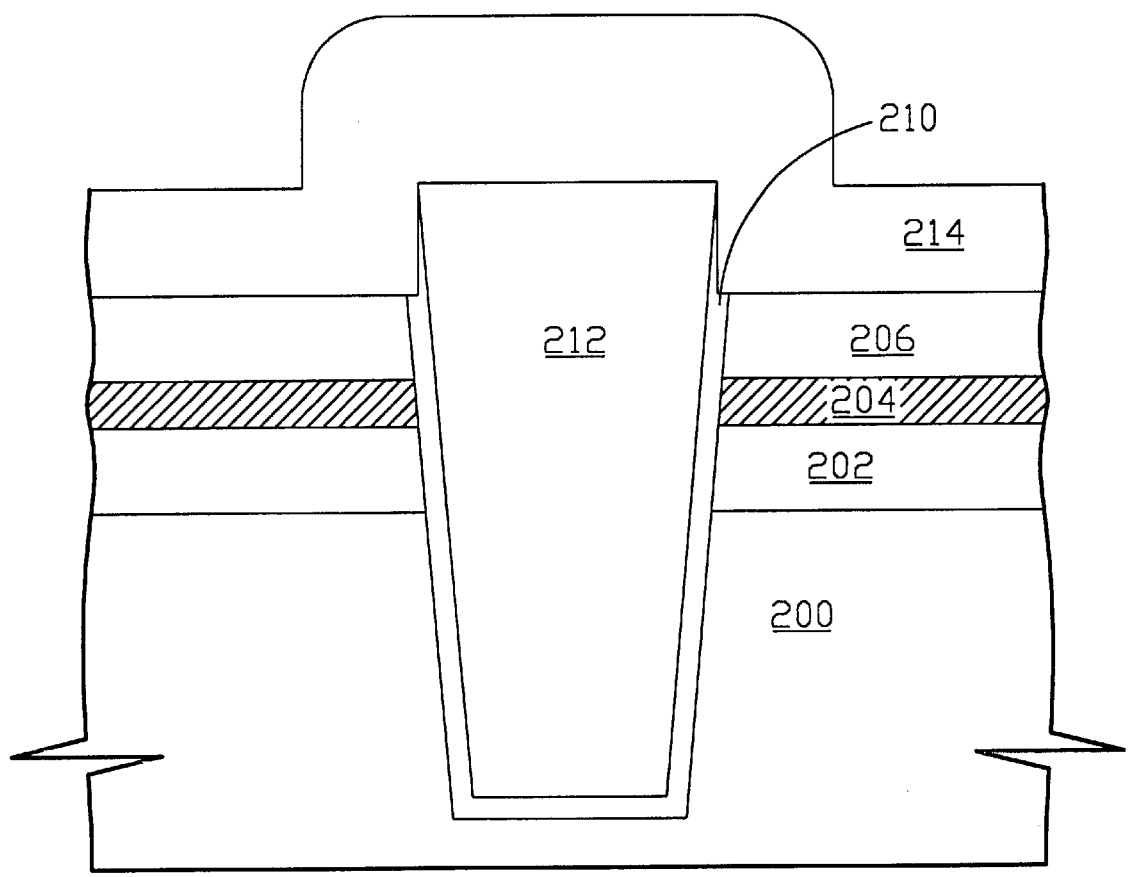
FIG. 2E shows a result of removing the top conductive layer shown in FIG. 2D and sequentially forming a dielectric layer thereon.

Referring to FIG. 2E, the conductive layer 208 is removed and a dielectric layer 214 is then conformally formed over the structure. The conductive layer 208 is preferably removed by using a dry etching process such as a reactive ion etching process. Other methods which can be used to remove the conductive layer 208 such as wet etching should not be excluded. The dielectric layer 214 preferably comprises, but is not limited to: a silicon dioxide layer formed by a low pressure chemical vapor deposition process.

Figure 2F:
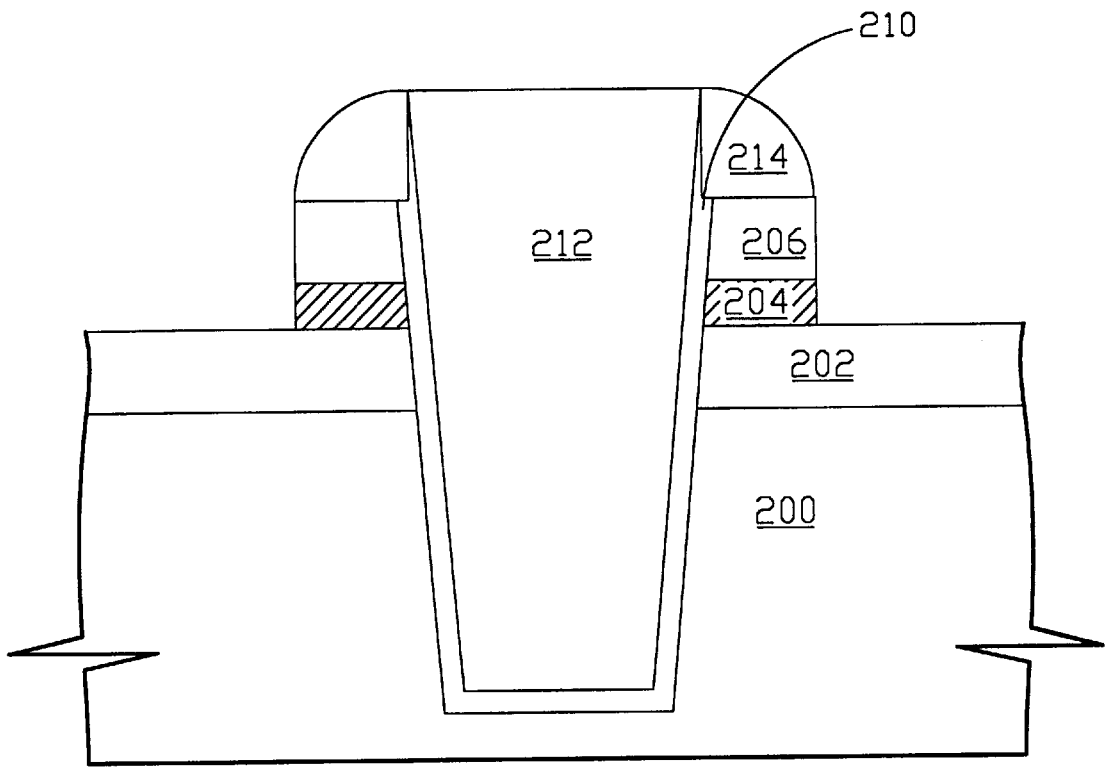
FIG. 2F shows a result of anisotropically etching the structure shown in FIG. 2E to form spacers of the STI.

Referring to FIG. 2F, the dielectric layer 214, the dielectric layer 206 and the conductive layer 204 are anisotropically etched to form protective spacers. The structure shown in FIG. 2F is formed by conventional process steps comprising: anisotropically etching the dielectric layer 214 by dry etching such as reactive ion etching, anisotropically etching the dielectric layer 206 by dry etching such as reactive ion etching and anisotropically etching the conductive layer 204 by dry etching such as reactive ion etching. The dielectric layers 214 and 206 can also be etched together, and due to the high selectivity between the dielectric layer 206 such as a silicon dioxide layer and the conductive layer 204 such as a polysilicon layer, the conductive layer 204 is used as an etching-stop layer to protect the underlying dielectric layer 202. The high selectivity between the conductive layer 204 such as a polysilicon layer and the dielectric layers 202, 206, 212 and 214 renders the dielectric layers 202, 206, 212 and 214 much less etched amid the etching process of the conductive layer 204. The dielectric layer 202 such as a pad oxide layer is used as a sacrificial (SAC) oxide so that no additional process used to form a SAC oxide is needed. To form active regions, n-type dopant ions such as phosphorus ions or p-type dopant ions such as boron ions are implanted into the substrate 200.

Figure 2G:
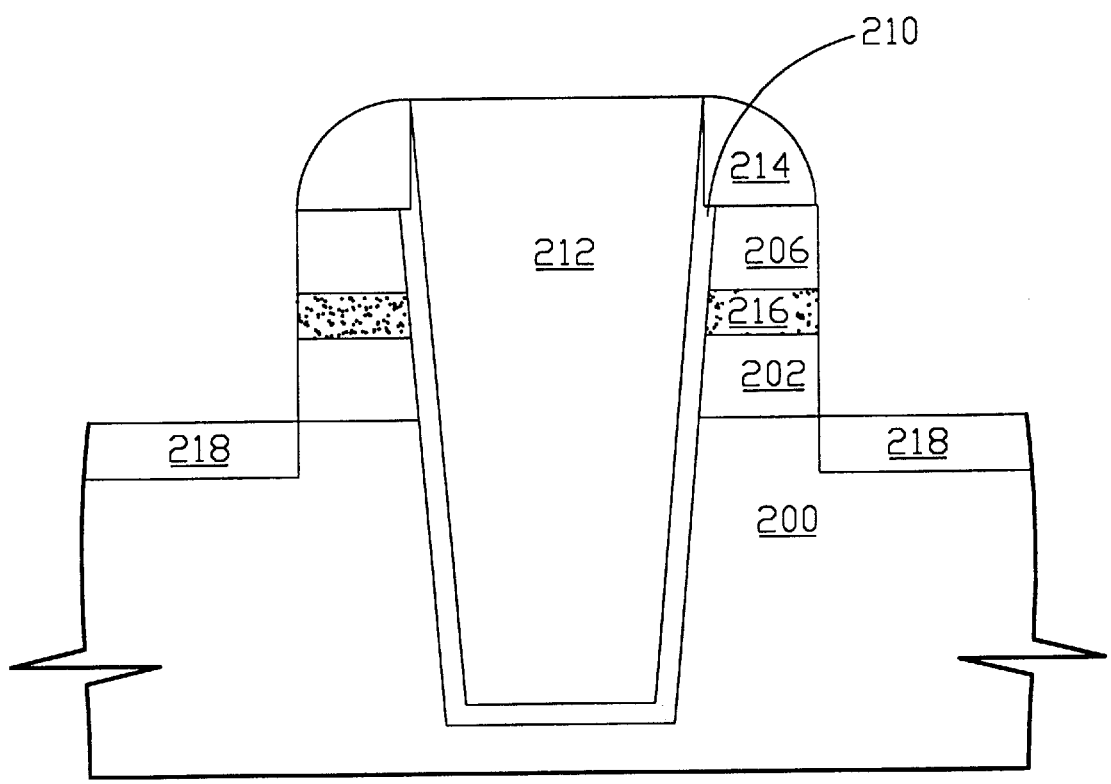
FIG. 2G shows a result of completing the STI of this invention and further oxidizing the substrate.

Referring to FIG. 2G, the dielectric layer 202 is etched to expose the substrate 200 and the substrate 200 such as a silicon substrate and the conductive layer 204 such as a polysilicon layer are further oxidized by using conventional methods used to form a gate oxide layer 218. The dielectric layer 202 is etched by using conventional methods such as dry etching or wet etching. The conductive layer 204 such as a polysilicon layer is oxidized to form a dielectric layer 216 comprising a silicon dioxide layer as the substrate 200 is oxidized. The conductive layer 204 such as a polysilicon layer has a twice oxidation rate than the substrate 200 such as a silicon substrate so that the conductive layer 204 will be transferred to the dielectric layer 216.

The invention avoids using any silicon nitride material to prevent the kooi effect and reduce the stress caused by silicon nitride. The invention also uses spacers to protect the corner portions of the STI. A conductive layer 204 comprising a polysilicon or an amorphous layer is used to replace the conventional used silicon nitride layer in the formation of conventional STI regions. The invention also uses a firstly formed dielectric layer 202 comprising a pad oxide layer as a sacrificial oxide layer so that an additional sacrificial oxide layer is no longer needed. The high selectivity ratio between the dielectric layer 202 comprising a silicon dioxide layer and the conductive layer 204 comprising a polysilicon or an amorphous silicon layer renders the dielectric layer 202 undamaged in the formation of the STI of this invention. The remaining conductive layer 204 comprising a polysilicon or an amorphous silicon layer will be oxidized together with the substrate 200 in the formation of the gate oxide layer 218 so that the isolation quality can be maintained. The spacers can protect the STI during the various process steps such as wet etching so that the isolation between adjacent active regions can be assured.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for forming a shallow trench isolation, said method comprising:

providing a substrate having a first dielectric layer thereon and a first conductive layer over said first dielectric layer;

forming a second dielectric layer over said first conductive layer;

forming a second conductive layer over said second dielectric layer;

forming a trench into said second conductive layer, said second dielectric layer, said first conductive layer, said first dielectric layer and said substrate;

conformally forming a linear dielectric layer over said trench;

filling said trench with a dielectric material to form a trench isolation;

removing said second conductive layer;

forming a third dielectric layer over said second dielectric layer and said trench isolation;

anisotropically etching said third dielectric layer and said second dielectric layer to expose said first conductive layer;

etching said first conductive layer to expose said first dielectric layer;

etching said first dielectric layer to expose said substrate; and oxidizing said substrate.

2. The method according to claim 1, wherein said first dielectric layer comprises a silicon dioxide layer.

3. The method according to claim 1, wherein said first conductive layer comprises a polysilicon layer.

4. The method according to claim 1, wherein said first conductive layer comprises an amorphous silicon layer.

5. The method according to claim 1, wherein said second conductive layer comprises a polysilicon layer.

6. The method according to claim 1, wherein said dielectric material comprises silicon dioxide.

7. The method according to claim 1, wherein said trench is filled by using a high density plasma chemical vapor deposition.

8. The method according to claim 1, wherein said third dielectric layer comprises a silicon dioxide layer.

9. A method for forming a shallow trench isolation, said method comprising:

providing a substrate having a pad oxide layer thereon and a first conductive layer over said pad oxide layer;

forming a first dielectric layer over said first conductive layer;

forming a second conductive layer over said first dielectric layer;

forming a trench into said second conductive layer, said first dielectric layer, said first conductive layer, said pad oxide layer and said substrate;

conformally forming a linear oxide layer over said trench;

filling said trench with a dielectric material to form a trench isolation;

removing said second conductive layer;

forming a second dielectric layer over said first dielectric layer and said trench isolation;

anisotropically etching said second dielectric layer and said first dielectric layer to expose said first conductive layer;

etching said first conductive layer to expose said pad oxide layer;

etching said pad oxide layer to expose said substrate; and oxidizing said substrate.

10. The method according to claim 9, wherein said first conductive layer comprises a polysilicon layer.

11. The method according to claim 9, wherein said first conductive layer comprises an amorphous silicon layer.

12. The method according to claim 9, wherein said second conductive layer comprises a polysilicon layer.

13. The method according to claim 9, wherein said dielectric material comprises silicon dioxide.

14. The method according to claim 9, wherein said trench is filled by using a high density plasma chemical vapor deposition.

15. The method according to claim 9, wherein said second dielectric layer comprises a silicon dioxide layer.

16. A method for forming a shallow trench isolation, said method comprising:

providing a substrate having a pad oxide layer thereon and a conductive layer over said pad oxide layer;

forming a first dielectric layer over said conductive layer;

forming a polysilicon layer over said first dielectric layer;

forming a trench into said polysilicon layer, said first dielectric layer, said conductive layer, said pad oxide layer and said substrate;

conformally forming a linear oxide layer over said trench;

filling said trench with a dielectric material to form a trench isolation;

removing said polysilicon layer;

forming a second dielectric layer over said first dielectric layer and said trench isolation;

anisotropically etching said second dielectric layer and said first dielectric layer to expose said conductive layer;

etching said conductive layer to expose said pad oxide layer;

etching said pad oxide layer to expose said substrate; and oxidizing said substrate.

17. The method according to claim 16, wherein said conductive layer comprises a polysilicon layer.

18. The method according to claim 16, wherein said conductive layer comprises an amorphous silicon layer.

19. The method according to claim 16, wherein said dielectric material comprises silicon dioxide.

20. The method according to claim 16, wherein said trench is filled by using a high density plasma chemical vapor deposition.

* * * * *